United States Patent
Kim

(10) Patent No.: US 8,007,980 B2
(45) Date of Patent: Aug. 30, 2011

(54) RESIST FOR PRINTING AND PATTERNING METHOD USING THE SAME

(75) Inventor: Jin Wuk Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 580 days.

(21) Appl. No.: 11/790,464

(22) Filed: Apr. 25, 2007

(65) Prior Publication Data
US 2007/0254239 A1 Nov. 1, 2007

(30) Foreign Application Priority Data
Apr. 26, 2006 (KR) .................. 10-2006-0037777

(51) Int. Cl.
*G03F 7/00* (2006.01)
*G03F 7/004* (2006.01)
*G03F 7/20* (2006.01)

(52) U.S. Cl. ......... 430/270.1; 430/7; 430/311; 430/396; 430/322

(58) Field of Classification Search .............. 430/7, 396, 430/270.1, 311, 322
See application file for complete search history.

(56) References Cited

U.S. PATENT DOCUMENTS

| | | | | |
|---|---|---|---|---|
| 4,500,447 A | * | 2/1985 | Kobayashi et al. | 252/511 |
| 4,515,884 A | * | 5/1985 | Field et al. | 430/124.36 |
| 4,759,970 A | * | 7/1988 | Seeger et al. | 428/209 |
| 5,264,284 A | * | 11/1993 | Miyata | 428/364 |
| 5,340,888 A | * | 8/1994 | Lemon et al. | 525/501 |
| 5,792,585 A | * | 8/1998 | Ida et al. | 430/191 |
| 5,814,431 A | * | 9/1998 | Nagasaka et al. | 430/281.1 |
| 5,847,028 A | * | 12/1998 | Iwase et al. | 523/414 |
| 5,928,836 A | * | 7/1999 | Rahman et al. | 430/270.1 |
| 6,133,335 A | * | 10/2000 | Mahoney et al. | 522/29 |
| 6,197,226 B1 | * | 3/2001 | Amagai et al. | 264/1.1 |
| 6,723,491 B2 | * | 4/2004 | Hannoch | 430/272.1 |
| 6,790,586 B2 | * | 9/2004 | Hatakeyama et al. | 430/270.1 |
| 7,441,500 B2 | * | 10/2008 | Kim | 101/170 |
| 7,452,567 B2 | * | 11/2008 | Baek et al. | 427/58 |
| 7,632,425 B1 | * | 12/2009 | Simone et al. | 252/182.3 |
| 2004/0119935 A1 | * | 6/2004 | Baek et al. | 349/187 |
| 2005/0136342 A1 | * | 6/2005 | Eun et al. | 430/7 |
| 2007/0238051 A1 | * | 10/2007 | Kim | 430/302 |
| 2007/0287099 A1 | * | 12/2007 | Kim | 430/302 |

FOREIGN PATENT DOCUMENTS

| | | |
|---|---|---|
| CN | 1132561 | 10/1996 |
| CN | 1629699 | 6/2005 |
| DE | 19716424 A1 * | 11/1998 |
| EP | 0 942 833 | 9/1999 |
| JP | 05262069 A * | 10/1993 |
| JP | 2005-209955 | 8/2005 |
| JP | 2008280537 A * | 11/2008 |

* cited by examiner

OTHER PUBLICATIONS

Lee, et al.; *Solvent Compatibility of Poly(dimethylsiloxane)-Based Microfluidic Device*; Analytical Chemistry, vol. 75, No. 23, Dec. 1, 2003; pp. 6544-6554.

*Primary Examiner* — Amanda C. Walke
(74) *Attorney, Agent, or Firm* — McKenna Long & Aldridge, L.L.P.

(57) ABSTRACT

A resist for printing that is coated on a printing roll and is then sequentially transcribed on a printing plate and a substrate including: a material wherein a cohesive energy between the resist and the printing plate is larger than a cohesive energy between the resist and a blanket formed on the surface of printing roll, and wherein a cohesive energy between the resist and the substrate is larger than the cohesive energy between the resist and the blanket formed on the surface of printing roll.

19 Claims, 6 Drawing Sheets

RESIST FOR PRINTING AND PATTERNING METHOD USING THE SAME

This application claims the benefit of Korean Patent Application No. 2006-37777 filed on Apr. 26, 2006, which is hereby incorporated by reference as if fully set forth herein.

BACKGROUND OF THE INVENTION

1. Field of the Invention

The present invention relates to a liquid crystal display (LCD) device, and more particularly, to a resist used for a printing method used in a patterning method for manufacturing an LCD device.

2. Discussion of the Related Art

Among various ultra-thin flat type display devices, which include a display screen having a thickness of several centimeters (cm), an LCD device may be widely used for notebook computers, monitors and aircraft due to the advantageous properties of low power consumption and portability.

The LCD device includes lower and upper substrates and a liquid crystal layer formed between the lower and upper substrates.

The lower substrate includes: gate and data lines crossing each other to define a unit pixel region; a thin film transistor switching element formed adjacent to a crossing of the gate and data lines; and a pixel electrode electrically connected to the thin film transistor.

The upper substrate includes: a black matrix layer to prevent light from leaking around the gate line, the data line and the thin film transistor; a color filter layer formed on the black matrix layer; and a common electrode formed on the color filter layer.

The LCD device includes various elements that are formed by performing processes repeatedly. In order to pattern the various elements of LCD device in various shapes, it is necessary to a use photolithography.

FIGS. 1A to 1D are cross sectional views illustrating a related art photolithography process.

First, as shown in FIG. 1A, a pattern material layer 20 and a photoresist layer 30 are sequentially formed on a first substrate 10.

Then, a mask having a predetermined pattern is positioned above the photoresist layer 30, and light is applied thereto from a light source, as shown in FIG. 1B.

Next, as shown in FIG. 1C, the pattern material layer 20 and the photoresist layer 30 are patterned by development and etching.

As shown in FIG. 1D, the photoresist layer 30 is removed by a photoresist stripper, thereby completing the pattern.

The photolithography process uses the mask with a predetermined pattern, whereby the manufacturing cost is increased because masks are expensive. Also, the manufacturing time increases and the process is complicated due to the development process.

To solve these problems in photolithography process, a new patterning method using a printing roll has been proposed.

FIGS. 2A to 2D are cross sectional views illustrating a patterning method using a printing roll according to the related art.

First, as shown in FIG. 2A, a photoresist 30 is applied onto a printing roll 60 having a blanket 65 through a printing nozzle 50, wherein the blanket 65 is adhered to the surface of printing roll 60. That is, the printing roll 60 is coated with the photoresist 30.

The blanket 65 is formed of resin that is elastic. When the photoresist 30 on printing roll 60 is transcribed on a printing plate 70, a frictional force between the printing roll 60 and the printing plate 70 is decreased due to the elasticity of the blanket 65.

Next, as shown in FIG. 2B, the printing roll 60 is rolled on the printing plate 70 having a plurality of protrusions. Thus, some of the photoresist 30 is transcribed on the protrusions of printing plate 70, and the remaining photoresist 30 forms a predetermined pattern on the printing roll 60.

As shown in FIG. 2C, the printing roll 60 is then rolled on a substrate 10 including the pattern material layer 20. Thus, the photoresist 30 is transcribed on the substrate 10 including the pattern material layer 20.

Then, as shown in FIG. 2D, the pattern material layer 20 is etched using the photoresist 30 as a mask. Then, the photoresist layer 30 is removed using a photoresist stripper, thereby completing the pattern.

The photoresist 30 may be used not only for the photolithography but also for the mask to etch the pattern material 20 in the patterning method using the printing roll 60.

The photoresist is suitable for the photolithography in that the properties of photoresist are changed by light. When using the photoresist in the patterning method using the printing roll without the exposure, a defective pattern may occur, so that it is impossible to obtain the desired pattern.

Thus, there is need for a new resist that may substitute for the photoresist in the patterning method using the printing roll.

SUMMARY OF THE INVENTION

Accordingly, the present invention is directed to a resist for printing and a patterning method using the same that substantially obviates one or more problems due to limitations and disadvantages of the related art.

An advantage of the present invention is to provide a resist for printing and a patterning method using the same, in which the resist is precisely transcribed on a printing plate and a substrate, thereby realizing a precise pattern of resist.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these objects and other advantages and in accordance with the purpose of the invention, as embodied and broadly described herein, a resist for printing that is coated on a printing roll and is then sequentially transcribed on a printing plate and a substrate includes: a material wherein a cohesive energy between the resist and the printing plate is larger than a cohesive energy between the resist and a blanket formed on the surface of printing roll, and wherein a cohesive energy between the resist and the substrate is larger than the cohesive energy between the resist and the blanket formed on the surface of printing roll.

In another aspect of the present invention, a patterning method includes: forming a pattern material layer on a substrate; coating a printing roll having a blanket adhered thereto with a resist for printing; transcribing some of the resist on a printing plate by rolling the printing roll on the printing plate; transcribing the remaining resist of printing roll on a substrate by rolling the printing roll on the substrate including the pattern material layer; etching the pattern material layer; and removing the resist for printing from the substrate, wherein the resist for printing includes a material wherein a cohesive energy between the resist and the printing plate is larger than a cohesive energy between the resist and a blanket formed on the surface of printing roll and wherein a cohesive energy between the resist and the substrate is larger than the cohesive energy between the resist and the blanket formed on the surface of printing roll.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, a resist for printing and a patterning method using the same according to the present invention will be explained with reference to the accompanying drawings.

Figure 1A:
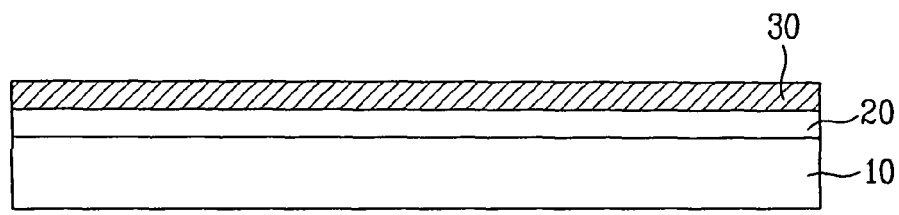
FIGS. 1A to 1D are cross sectional views illustrating a photolithography process according to the related art.
Figure 1B:
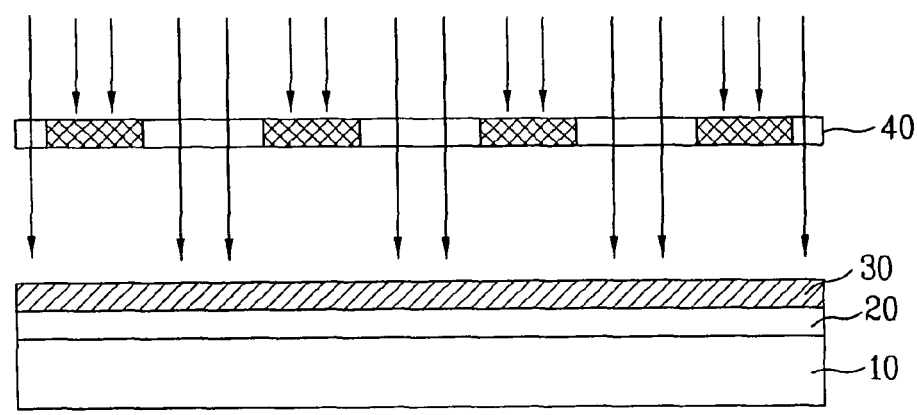
Figure 1C:
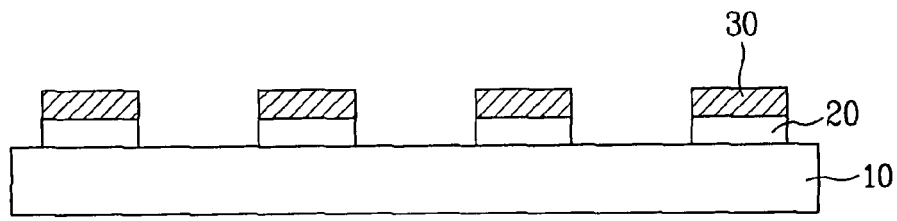
Figure 1D:
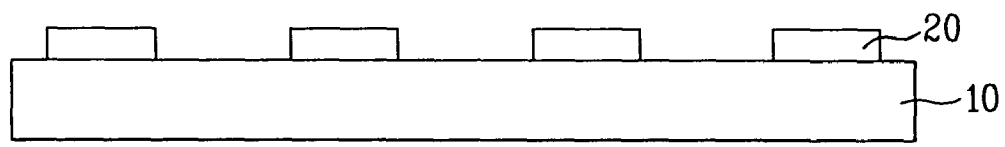
Figure 2A:
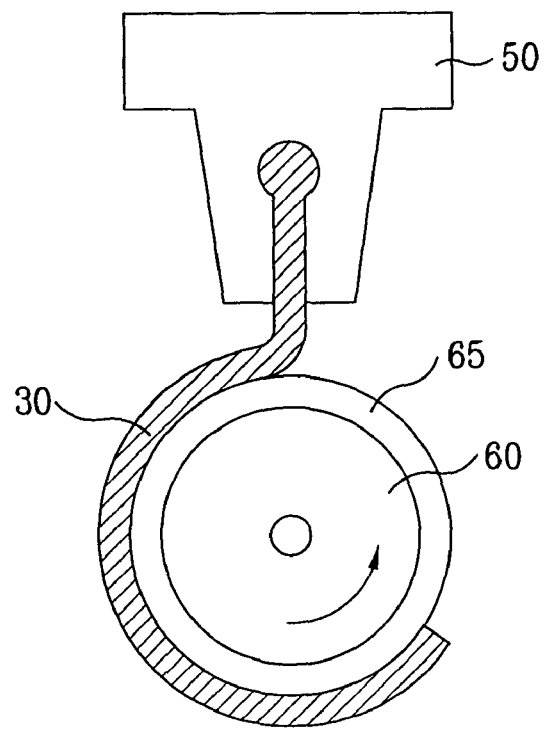
FIGS. 2A to 2D are cross sectional views illustrating a patterning method using a printing roll according to the related art.
Figure 2B:
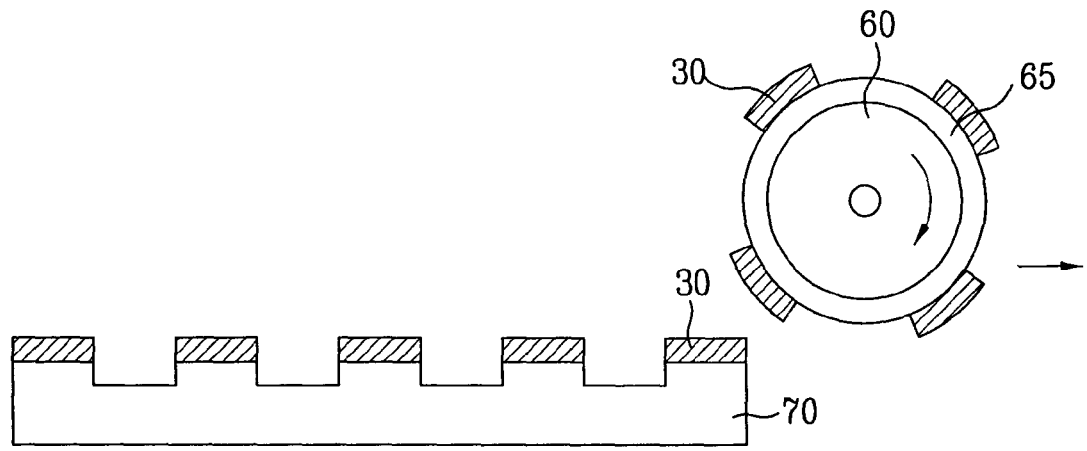
Figure 2C:
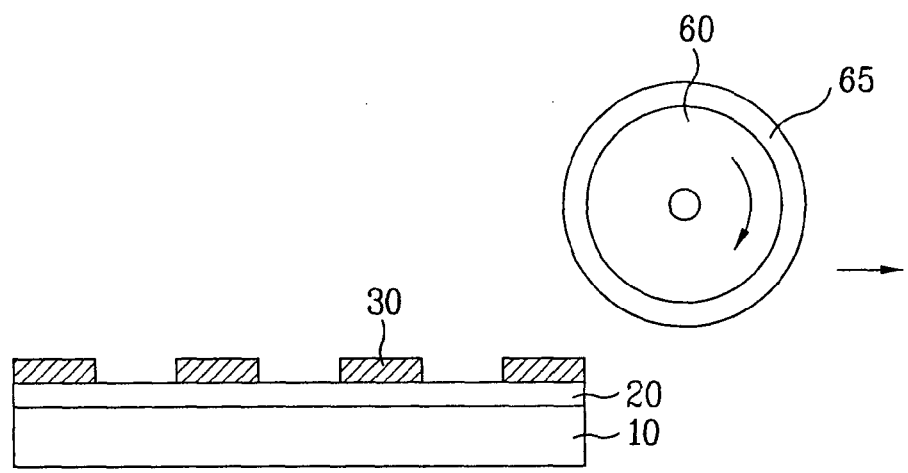
Figure 2D:
Figure 3:
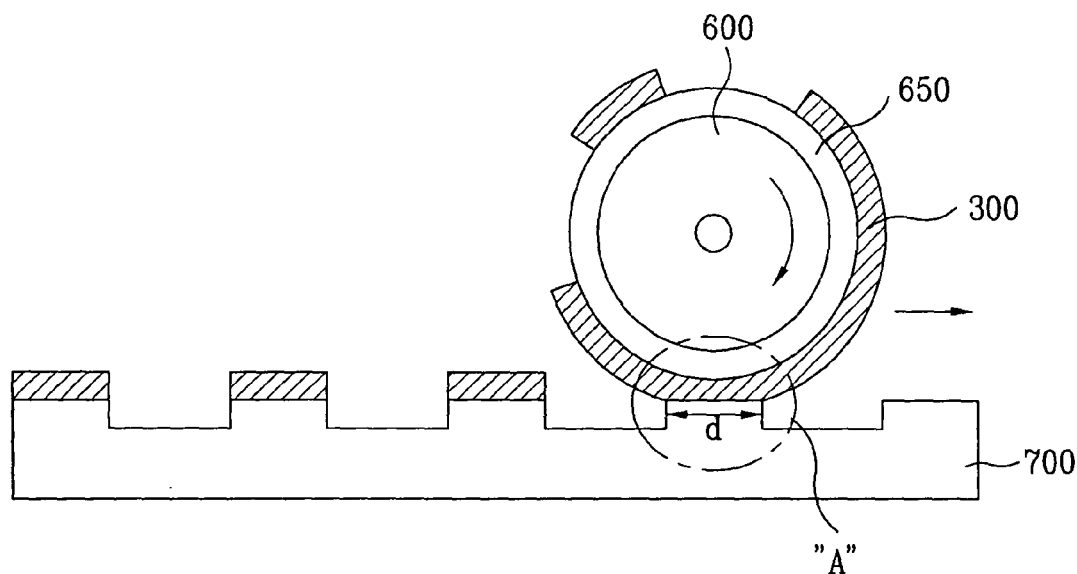
FIG. 3 is a cross sectional view illustrating a process of transcribing a resist on a printing plate according to the preferred embodiment of the present invention.
Figure 4:
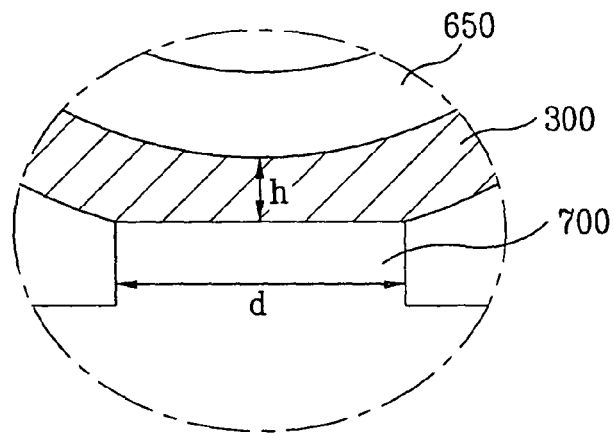
FIG. 4 is an expanded view of illustrating a portion "A" of FIG. 3.

FIG. 3 is a cross sectional view illustrating a process of transcribing a resist on a printing plate according to the preferred embodiment of the present invention. FIG. 4 is an expanded view of illustrating portion "A" of FIG. 3.

In this case, a substrate (not shown) is formed of the same material as a printing plate 700, the relationship between substrate and resist for printing is the same as that between resist for printing and printing plate 700, so that there will be no additional explanation.

As shown in the following equation 1, in the preferred embodiment of the present invention, a surface energy ($\gamma_R$) of resist 300 for printing is larger than a surface energy ($\gamma_B$) of blanket 650 formed on a surface of printing roll 600, and is also smaller than a surface energy ($\gamma_C$) of the printing plate 700.

$$\gamma_B < \gamma_R < \gamma_C \quad \text{[Equation 1]}$$

The blanket 650 is formed of Si-based elastic material, for example, PDMS (polydimethyl siloxane), and the surface energy ($\gamma_R$) of blanket 650 is about 20 mJ/m². Also, the printing plate 700 is formed of glass or resin, and the surface energy ($\gamma_C$) of printing plate 700 is about 50 mJ/m² or more or example, if using a printing plate 700 of glass, the surface energy ($\gamma_C$) of printing plate 700 is about 100 mJ/m².

Accordingly, the surface energy ($\gamma_R$) of the resist 300 is larger than the surface energy ($\gamma_B$) of blanket 650, and the surface energy ($\gamma_R$) of resist 300 is smaller than the surface energy ($\gamma_C$) of printing plate 700, 50 mJ/m². Preferably, when the surface energy ($\gamma_R$) of resist 300 is 25~40 mJ/m², the transcription ratio of resist pattern to the printing plate or blanket, the edge sharpness of resist pattern and resolution of resist pattern improve, whereby the resist 300 is easily separated from the blanket 650 and is then precisely transcribed on the printing plate 700.

When the resist 300 is coated on the blanket 650, the resist 300 is mixed with a solvent. In this case, because the surface energy of mixture of the resist 300 and the solvent is similar to or slightly smaller than 20 mJ/m² corresponding to the surface energy of blanket 650, the mixture of resist 300 and solvent is easily coated on the blanket 650 having the relatively large surface energy.

As soon as the mixture is coated on the blanket 650, the solvent in mixture vaporizes. So there is not any solvent 300 left on the printing plate 700 when the resist 300 is transcribed onto the printing plate 700. As a result, the resist 300 is easily separated from the blanket 650.

As shown in the following equation 2, a cohesive energy ($W_{RC}$) between the resist 300 and the printing plate 700 is larger than a cohesive energy ($W_{RB}$) between the resist and the blanket 650 formed on the surface of printing roll 600, preferably.

$$W_{RB} < W_{RC} \quad \text{[Equation 2]}$$

"$W_{RB}$" and "$W_{RC}$" may be expressed by the following equation 3.

$$W_{RB} = \gamma_R + \gamma_B - \gamma_{RB}$$

$$W_{RC} = \gamma_R + \gamma_C - \gamma_{RC} \quad \text{[Equation 3]}$$

In the above equations, "$\gamma_R$" indicates the surface energy of resist 300, "$\gamma_B$" indicates the surface energy of blanket 650, and "$\gamma_C$" indicates the surface energy of printing plate 700. Also, "$\gamma_{RB}$" indicates the surface energy of interface between the resist 300 and the blanket 650, and "$\gamma_{RC}$" indicates the surface energy of interface between the blanket 650 and the printing plate 700.

In order to measure the cohesive energy required to separate the two materials formed at the interface, the surface energy of first material is added to the surface energy of second material, and then the surface energy of interface between the two materials is subtracted from the result obtained by adding the surface energy of first material and the surface energy of second material.

However, it is difficult to measure the surface energy of interface between the two materials ($\gamma_{RB}$, $\gamma_{RC}$). Accordingly, the cohesive energy is measured by using a polar and a dispersion term of surface energy of the resist 300, the blanket 650 and the printing plate 700 ($\gamma_R$, $\gamma_B$, $\gamma_C$).

The following equation 4 expresses the cohesive energy of interface between the first and second materials when the first material has the low surface energy and the second material has the high surface energy. The following equation 5 expresses the cohesive energy of interface between the first and second materials when the first and second materials have the low surface energies.

$$W_{RB} = 2(\gamma_R^d \gamma_B^d)^{1/2} + 2(\gamma_R^p \gamma_B^p)^{1/2}$$

$$W_{RC} = 2(\gamma_R^d \gamma_C^d)^{1/2} + 2(\gamma_R^p \gamma_C^p)^{1/2} \quad \text{[Equation 4]}$$

$$W_{RB}=[4(\gamma_R{}^d\gamma_B{}^d)/(\gamma_R{}^d+\gamma_B{}^d)]+[4(\gamma_R{}^p\gamma_B{}^p)/(\gamma_R{}^p+\gamma_B{}^p)]$$

$$W_{RC}=[4(\gamma_R{}^d\gamma_C{}^d)/(\gamma_R{}^d+\gamma_C{}^d)]+[4(\gamma_R{}^p\gamma_C{}^p)/(\gamma_R{}^p+\gamma_C{}^p)] \quad \text{[Equation 5]}$$

In the above equations 4 and 5, "d" indicates the dispersion term, and "p" indicates the polar term.

The following table 1 shows the virtual measurements $\gamma^d$ and $\gamma_p$ of the blanket 650, the resist 300 and the printing plate 700 in order to measure the cohesive energy based on the above equations 4 and 5.

TABLE 1

| | $\gamma^d$ | $\gamma^p$ |
|---|---|---|
| Blanket(PDMS) | 18.8 | 1.6 |
| Resist(novolak) | 42.2 | 2.0 |
| Printing plate(glass) | 52 | 47 |

In the above table 1, the blanket 650 is formed of PDMS, and the printing plate 700 is formed of glass. Also, the resist 300 of the present invention is formed of novolak resin.

By applying the above-mentioned data to the equations 4 and 5, it is possible to measure the cohesive energy between the resist 300 and the blanket 650 and the cohesive energy between the resist 300 and the printing plate 700. The cohesive energy ($W_{RB}$) between the resist 300 and the blanket 650, that is, the cohesive energy between novolak resin and PDMS, is computed using equation 5, because novolak resin and PDMS have the low surface energies. The values of $\gamma^d$ and $\gamma^p$ of the blanket 650 and the resist 300 shown in the table 1 are input to the equation 5 resulting in $W_{RB}\approx 55.6$ mJ/m$^2$.

In the meantime, because the glass has the high surface energy, the cohesive energy ($W_{RC}$) between the resist 300 and the printing plate 700, that is, the cohesive energy between novolak resin and glass is computed using equation 4. The values of $\gamma^d$, $\gamma^p$ of the resist 300 and the printing plate 700 shown in the table 1 are input to the equation 4 resulting in $W_{RC}=113.1$ mJ/m$^2$.

A comparison between $W_{RB}$ and $W_{RC}$ shows that $W_{RB} < W_{RC}$. The cohesive energy ($W_{RC}$) between the resist 300 and the printing plate 700 is larger than the cohesive energy ($W_{RB}$) between the resist 300 and the blanket 650. Accordingly, the transcription ratio of resist pattern to the printing plate or blanket, the edge sharpness of resist pattern and resolution of resist pattern improve, whereby the resist 300 is easily separated from the blanket 650 and is precisely transcribed on the printing plate 700.

Also, the cohesive energy between the resist 300 and the blanket 650 is subtracted from the cohesive energy between the resist 300 and the printing plate 700, and this result is then multiplied by a distance (d) of a protrusion formed on the printing plate 700, thereby obtaining a first value. Then, a fracture energy (G) of the resist 300 is multiplied by a thickness (h) of the resist 300 coated on the blanket 650, thereby obtaining a second value. At this time, the first value is larger than the second value.

In order to transcribe the resist 300 on the printing plate 700 precisely, how well the resist 300 is fractured as well as the cohesive energy should be considered.

The total cohesive energy of resist 300 is determined by the cohesive energy ($W_{RC}$) between the resist 300 and the printing plate 700, the cohesive energy ($W_{RB}$) between the resist 300 and the blanket 650, and the contact area ($S_1$) between the protrusion of printing plate 700 and the resist 300. At this time, because "$W_{RC}$" is opposite to "$W_{RB}$", the total cohesive energy of the resist 300 corresponds to ($W_{RC}-W_{RB})S_1$.

Also, the total fracture energy of the resist 300 is determined based on the fracture energy (G) of the resist 300 and the cross section area ($S_2$) of the resist 300. The fracture energy (G) of the resist 300 indicates the energy required per unit area when fracturing the same material, wherein the total fracture energy of the resist 300 corresponds to $GS_2$.

As shown in the following equation 6, when the total cohesive energy of the resist 300 is larger than the total fracture energy of the resist 300, the transcription ratio of resist pattern to the printing plate or blanket, the edge sharpness of resist pattern and resolution of resist pattern improve, whereby the resist 300 is precisely transcribed onto the printing plate 700.

$$GS_2 < (W_{RC}-W_{RB})S_1 \quad \text{[Equation 6]}$$

In this case, "$S_1$" corresponds to the contact area between the protrusion of printing plate 700 and the resist 300, wherein "$S_1$", is measured by multiplying the distance (d) of the protrusion in the printing plate 700 and the width (l) of printing plate 700 together. Also, "$S_2$" corresponds to the cross section area of resist 300 transcribed on the protrusion of printing plate 700, wherein "$S_2$" is measured by multiplying the width (l) of printing plate 700 and the thickness (h) of resist 300 together.

Because the width (l) of printing plate 700 is a common factor to both $S_1$ and $S_2$, the equation 6 is transformed into the following equation 7.

$$Gh < (W_{RC}-W_{RB})d \quad \text{[Equation 7]}$$

If using a blanket 650 of PDMS, a resist 300 of novolak resin and a printing plate 700 of glass, $W_{RC}-W_{RB}=113.1-55.6=57.5$ mJ/m$^2$. On the assumption that the distance of protrusion in the printing plate 700 is 10□ and the thickness of resist 300 is 1□, the fracture energy (G) of the resist 300 is smaller than 575 mJ/m$^2$, preferably.

Also, the equation 7 is useful to determine the thickness of the resist 300. Under the above-mentioned conditions, if $W_{RC}-W_{RB}=57.5$ mJ/m$^2$ and G=575, the thickness of resist 300 is smaller than 1 μm, whereby the resist 300 is easily transcribed on the printing plate 700.

As the fracture energy of the resist 300 becomes smaller, the difference between the fracture energy of the resist 300 and the cohesive energy of the resist 300 becomes larger. Thus, the transcription ratio of resist pattern to the printing plate or blanket, the edge sharpness of resist pattern and resolution of resist pattern improve, whereby the resist 300 is easily transcribed on the printing plate 700.

As known from the following equation 8, the fracture energy is closely related with the molecular weight of the resist 300.

$$G \propto \sqrt{M} \quad \text{[Equation 8]}$$

Figure 5:
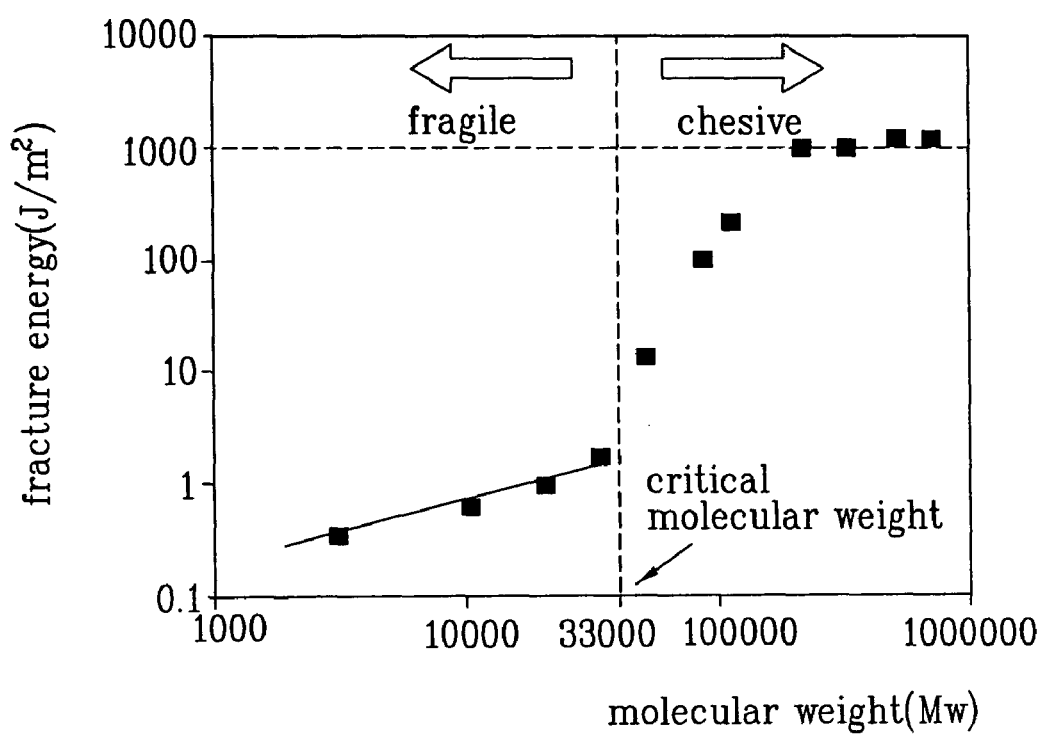
FIG. 5 is a graph illustrating fracture energy versus molecular weight of a polymer.

FIG. 5 is a graph illustrating the fracture energy versus the molecular weight of a polymer, according to the equation 8. As shown in FIG. 5, the fracture energy (G) is sharply changed at a critical molecular weight (Mc). Generally, if the fracture energy (G) is smaller than 1 J/m$^2$, it is fragile. Meanwhile, if the fracture energy (G) is larger than 1 J/m$^2$, it is cohesive. If the molecular weight having the fracture energy (G) of 1 J/m$^2$ is defined by the critical molecular weight (Mc), its value is about 33,000. In order to easily transcribe the resist 300 on the printing plate 700, the fracture energy (G) is smaller than 1 J/m$^2$, preferably. To obtain the fracture energy (G) which is smaller than 1 J/m$^2$, the molecular weight of resist 300 should be smaller than 33,000.

Also, when the resist 300 is coated on the blanket 650, the solubility parameter ($\delta_S$) of solvent mixed with the resist 300 is smaller than 6 cal$^{1/2}$ cm$^{-3/2}$ or is larger than 11 cal$^{1/2}$ cm$^{-3/2}$.

When the resist 300 is coated on the blanket 650, the solvent mixed with the resist 300 permeates into the blanket 650 formed on the surface of printing roll 600, whereby the blanket 650 may be deformed. This deformation of the blanket 650 becomes serious when the solubility parameter of blanket 650 is similar to the solubility parameter of the solvent.

In theory, the solvent is selected such that the interaction parameter ($\chi$) defined by the following equation 9 based on Flory-Huggins is maximized, to thereby minimize the deformation of the blanket 650 by preventing the blanket from swelling.

$$\chi = (\delta_B - \delta_S)^2 \qquad \text{[Equation 9]}$$

In the above equation 9, if the solubility parameter ($\delta_B$) of the blanket 650 is similar to the solubility parameter ($\delta S$) of solvent, the interaction parameter ($\chi$) closely approximates to "0". Having the interaction parameter ($\chi$) close to "0" means that the solvent and the blanket 650 recognize themselves as the same material. That is, if the interaction parameter closely approximates to "0", the solvent and the blanket 650 are mixed well. If the solvent is mixed with the blanket 650, there is high possibility that the blanket 650 is deformed. In order to prevent the blanket 650 from being deformed, it is preferable to select the solvent to make the interaction parameter ($\chi$) maximum.

Figure 6:
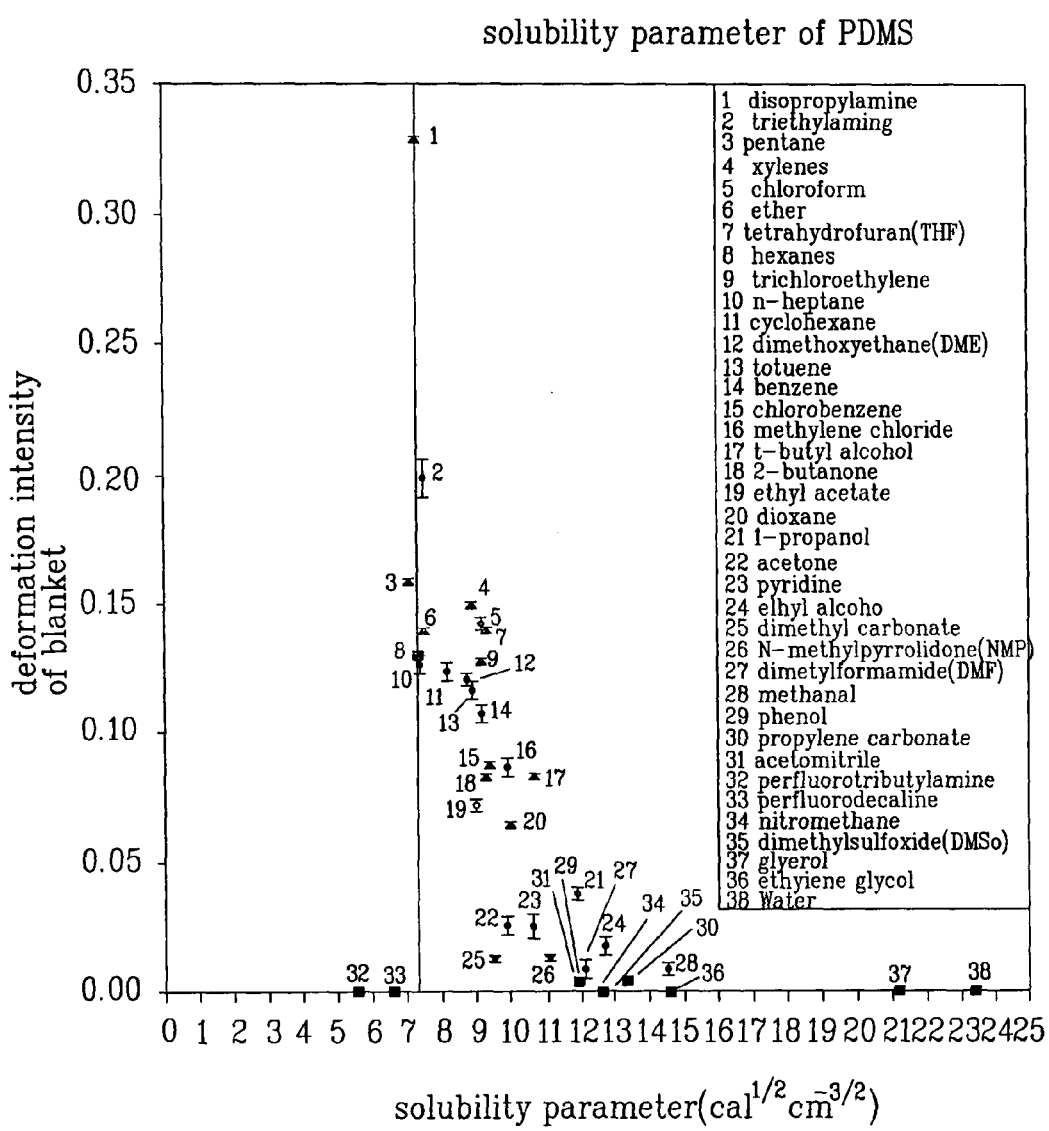
FIG. 6 is a graph illustrating a deformation intensity of the blanket versus the solubility parameter of various solvents.

FIG. 6 is a graph illustrating the deformation intensity of blanket versus the solubility parameter of various solvents when using a blanket 650 of PDMS. As shown in FIG. 6, the solubility parameter of PDMS is 7.3 $cal^{1/2}$ $cm^{-3/2}$, and the deformation intensity of blanket 650 is varied based on PDMS and the solubility parameter of various solvents.

In more detail, when the solubility parameter ($\delta_S$) of solvent is smaller than 6 $cal^{1/2}$ $cm^{-3/2}$ or is larger than 11 $cal^{1/2}$ $cm^{-3/2}$, there is no deformation in the blanket 650. If the solubility parameter ($\delta_S$) of solvent is smaller than 6 $cal^{1/2}$ $cm^{-3/2}$ or is larger than 11 $cal^{1/2}$ $cm^{-3/2}$, there is large difference between the solubility parameter of solvent and the solubility parameter of PDMS, whereby the value of interaction parameter ($\chi$) becomes large. If the value of interaction parameter ($\chi$) becomes large, the solvent and the blanket 650 recognize themselves as different materials, so that they do not mix. Thus, the solvent does not permeate into the blanket 650, so that it is possible to prevent the blanket 650 from being deformed.

Even though the solvents having the same solubility parameter are used, there may be a case where the deformation intensity of the blanket 650 is different. There is the example, as shown in FIG. 6, of methylene chloride 16 and acetone 22. Both methylene chloride 16 and acetone 22 have the same solubility parameter of about 10 $cal^{1/2}$ $cm^{-3/2}$. If the two materials have the same solubility parameter, they have the same interaction parameter ($\chi$). Thus, the two materials are supposed to have the same deformation intensity in the blanket. However, even though methylene chloride and acetone have the same solubility parameter, methylene chloride deforms the blanket 650 three times more than acetone. This is caused by the difference of dipole moment ($\mu$) between the blanket and the solvent.

At this time, PDMS for the blanket 650 has the polar properties. Thus, as the solvent has the smaller dipole moment ($\mu$), the ability to deform the blanket 650 increase. Thus, because the large dipole moment indicates great polar properties, the solvent having the large dipole moment ($\mu$) is selected so as to prevent the blanket from being deformed by preventing the blanket from swelling.

At this time, methylene chloride has $\mu_m$=1.6 D and acetone has $\mu_a$=2.9 D. When using methylene chloride as a solvent, the blanket 650 is deformed more seriously as compared to using acetone as a solvent. Accordingly, when the resist 300 is coated on the printing roll 600, the dipole moment ($\mu$) of the solvent mixed with the resist 300 is preferably larger than 2 D.

In order to form the pattern of resist 300 for printing, a pattern material layer is first formed on a substrate. Then, the resist 300 is coated on the printing roll 600 having the blanket 650, wherein the blanket 650 is formed of PDMS. At this time, the solubility parameter of resist 300 is smaller than 6 $cal^{1/2}$ $cm^{-3/2}$ or is larger than 11 $cal^{1/2}$ $cm^{-3/2}$. Also, the resist 300 is mixed with a solvent having a dipole moment larger than 2 D. As soon as the resist 300 is coated on the blanket 650, the solvent vaporizes.

Then, the printing roll 600 is rolled on the printing plate 700, so that some of the resist 300 is transcribed onto the printing plate 700. Then, as the printing roll 600 is rolled on the substrate including the pattern material layer, the remaining resist 300 of printing roll 600 is transcribed on the substrate.

After etching the pattern material layer, the resist 300 is removed from the substrate, thereby completing the pattern.

As mentioned above, the resist for printing and the patterning method using the same according to the present invention have the following advantages.

In the patterning method according to the present invention, the resist for printing is easily separated from the blanket and is precisely transcribed on the printing plate and the substrate. As a result, the defects in the pattern is decreased so that a precise pattern is formed.

Unlike photolithography, the patterning method using the resist does not require development so that the manufacturing time is decreased.

When the resist is coated on the printing roll, the blanket is not deformed by the solvent mixed with the resist, so that the cost of part replacement is decreased.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A resist for printing that is coated on a printing roll and is then sequentially transcribed on a printing plate and a substrate comprising:

a material wherein a cohesive energy between the resist and the printing plate is larger than a cohesive energy between the resist and a blanket formed on the surface of printing roll, and wherein a cohesive energy between the resist and the substrate is larger than the cohesive energy between the resist and the blanket formed on the surface of printing roll, wherein the resist for printing is mixed with a solvent including any one among perfluorotributylamine, nitromethane, dimethysulfoxide, ethylene glycol, glycerol, and water when coating the printing roll with the resist, and wherein the solvent vaporizes as soon as the resist for printing mixed with the solvent is coated on the blanket and a surface energy of mixture of the resist and the solvent is similar to or slightly smaller than a surface energy of the blanket;

wherein a total cohesive energy of the resist with the printing plate and blanket is greater than a total fracture energy required for fracturing the resist coated on the blanket; and wherein a first value obtained by subtracting the cohesive energy between the resist and the blanket from the cohesive energy between the resist and the printing plate and multiplying the subtraction result and a distance of a protrusion formed on the printing plate together is greater than a second value obtained by multiplying a fracture energy of the resist and a thickness of the resist coated on the blanket together.

2. The resist of claim 1, wherein the fracture energy is less than 1000 mJ/m$^2$.

3. The resist of claim 1, wherein a molecular weight of resist is less than 33,000.

4. The resist of claim 1, wherein a surface energy of the resist for printing is greater than a surface energy of the blanket and is also less than a surface energy of the printing plate and substrate.

5. The resist of claim 4, wherein the surface energy of the resist for printing is greater than 25 mJ/m$^2$ and is smaller than 40 mJ/m$^2$.

6. The resist of claim 1, wherein a solubility parameter of the solvent is different from that of the resist for printing when coating the printing roll with the resist.

7. The resist of claim 6, wherein the solubility parameter of solvent is less than 6 cal$^{1/2}$ cm$^{-3/2}$ or is greater than 11 cal$^{1/2}$ cm$^{3/2}$.

8. The resist of claim 6, wherein the dipole moment value of the solvent is different from the dipole moment value of the blanket.

9. The resist of claim 8, wherein the dipole moment value of the solvent is larger than 2D.

10. A patterning method comprising:
forming a pattern material layer on a substrate;
coating a printing roll having a blanket adhered thereto with a resist for printing mixed with a solvent, wherein the solvent vaporizes as soon as the resist for printing mixed with the solvent is coated on the blanket and a surface energy of mixture of the resist and the solvent is similar to or slightly smaller than a surface energy of the blanket;
transcribing some of the resist on a printing plate by rolling the printing roll on the printing plate;
transcribing the remaining resist of printing roll on a substrate by rolling the printing roll on the substrate including the pattern material layer;
etching the pattern material layer; and
removing the resist for printing from the substrate, wherein the resist for printing includes a material wherein a cohesive energy between the resist and the printing plate is larger than a cohesive energy between the resist and a blanket formed on the surface of printing roll and wherein a cohesive energy between the resist and the substrate is larger than the cohesive energy between the resist and the blanket formed on the surface of printing roll, and wherein the solvent including any one among perfluorotributylamine, nitromethane, dimethysulfoxide, ethylene glycol, glycerol, and water when coating the printing roll with the resist;

wherein a total cohesive energy of the resist with the printing plate and blanket is greater than a total fracture energy required for fracturing the resist coated on the blanket; and wherein a first value obtained by subtracting the cohesive energy between the resist and the blanket from the cohesive energy between the resist and the printing plate and multiplying the subtraction result and a distance of a protrusion formed on the printing plate together is greater than a second value obtained by multiplying a fracture energy of the resist and a thickness of the resist coated on the blanket together.

11. The patterning method of claim 10, wherein the blanket provided on the surface of printing roll is formed of PDMS (polydimethyl siloxane).

12. The resist of claim 10, wherein the fracture energy is less than 1000 mJ/m$^2$.

13. The resist of claim 10, wherein a molecular weight of resist is less than 33,000.

14. The resist of claim 10, wherein a surface energy of the resist for printing is greater than a surface energy of the blanket and is also less than a surface energy of the printing plate and substrate.

15. The resist of claim 14, wherein the surface energy of the resist for printing is greater than 25 mJ/m$^2$ and is smaller than 40 mJ/m$^2$.

16. The resist of claim 10, wherein a solubility parameter of the solvent is different from that of the resist for printing when coating the printing roll with the resist.

17. The resist of claim 16, wherein the solubility parameter of solvent is less than 6 cal$^{1/2}$ cm$^{-3/2}$ or is greater than 11 cal$^{1/2}$ cm$^{-3/2}$.

18. The resist of claim 16, wherein the dipole moment value of the solvent is different from the dipole moment value of the blanket.

19. The resist of claim 10, wherein the dipole moment value of the solvent is larger than 2 D.

* * * * *